United States Patent [19]

Momose et al.

[11] Patent Number: 4,754,318

[45] Date of Patent: Jun. 28, 1988

[54] SEMICONDUCTOR DEVICE

[75] Inventors: Hiroshi Momose; Hideki Shibata; Hiroshi Nozawa, all of Yokohama, Japan

[73] Assignee: Kabushiki Kaisha Toshiba, Kawasaki, Japan

[21] Appl. No.: 912,536

[22] Filed: Sep. 29, 1986

[30] Foreign Application Priority Data

Sep. 30, 1985 [JP] Japan ............................... 60-216594

[51] Int. Cl.4 ............................................. H01L 23/48
[52] U.S. Cl. ....................................... 357/71; 357/65; 357/68
[58] Field of Search ............................... 357/71, 65, 68

[56] References Cited

U.S. PATENT DOCUMENTS

| 3,936,865 | 2/1976 | Robinson | 357/71 |
| 4,110,776 | 8/1978 | Rao et al. | 357/23 |
| 4,316,200 | 2/1982 | Ames et al. | 357/71 |
| 4,507,852 | 4/1985 | Karulkar | 357/71 |

FOREIGN PATENT DOCUMENTS 58-215055 12/1983 Japan ..................................... 357/71

Primary Examiner—Martin H. Edlow
Assistant Examiner—Gregory Key
Attorney, Agent, or Firm—Finnegan, Henderson, Farabow, Garrett & Dunner

[57] ABSTRACT

A semiconductor device has a semiconductor substrate, a first insulating layer formed on the substrate, a conductive body formed on the first insulating layer, a second insulating layer formed on the first insulating layer and the conductive body and having a contact hole formed at a contact area to reach the conductive body, and a first conductive layer formed on the second insulating layer and the conductive body. The conductive body has a conductive member formed on the first insulating layer in the contact area, and a second conductive layer formed on the first insulating layer and the conductive member.

10 Claims, 1 Drawing Sheet

SEMICONDUCTOR DEVICE

BACKGROUND OF THE INVENTION

The present invention relates to a semiconductor device and, more particularly, to a semiconductor device having a contact area for connecting upper and lower conductive layers.

FIG. 1 shows a conventional semiconductor device having a contact area for connecting upper and lower conductive layers. This semiconductor device has semiconductor substrate 1, insulating layer 2 formed on substrate 1 and having a thickness of, e.g., 4,000Å (=0.4 μm), lower conductive layer 3 formed on insulating layer 2 and having a thickness of, e.g., 3,000 to 4,000Å, thick insulating layer 4 formed on layers 2 and 3 to expose part of layer 3 and having a thickness of, e.g., 7,000Å, and upper conductive layer 5 formed on layer 4 and the exposed portion of lower conductive layer 3. The contact portion of lower and upper conductive layers 3 and 5 constitutes contact area 6. Layers 2 and 4 are made of the same insulating material such as $SiO_2$.

Conventionally, when part of layer 3 is exposed, i.e., when a contact hole is formed in layer 4, an anisotropic etching method, e.g., a reactive ion etching method (RIE), is used to partially etch layer 4, so that the integrated circuit can be micropatterned. Along with the micronization of the integrated circuit pattern, the width and thickness of layer 3 must be reduced. Furthermore, in a static RAM, a polycrystalline silicon layer for forming lower conductive layer 3 must be selectively made very thin in order to make the selected part highly resistive and form a high-resistance element of the polycrystalline silicon layer as the load element of each memory cell. In this manner, as the integrated circuit is micropatterned and highly integrated, the thickness of layer 3 tends to be further reduced. This is also applied to an active element formed in part of the polycrystalline silicon layer.

When a contact hole is formed in layer 4 by the RIE method, the ratio of the etching rate of layer 4 to the etching rate of layer 3 (etching selectivity) is not very large, but usually less than 10. Accordingly, when lower conductive layer 3A having a very small thickness of, e.g., 500Å, is formed, if part of insulating layer 4 is etched at a small etching selectivity and an etching time 1.5 times a normal etching time in consideration of an allowable error or processing margin, not only the part of layer 4 but also the corresponding portion of layer 3A is etched. In addition, part of insulating layer 2 is etched to partially expose substrate 1. In this state, when upper conductive layer 5A is formed, it is in direct contact with the exposed portion of substrate 1.

SUMMARY OF THE INVENTION

It is an object of the present invention to provide a semiconductor device wherein upper and lower conductive layers are formed in a contact area to sufficiently contact with each other without contacting a substrate.

The above object is achieved by a semiconductor device comprising a semiconductor substrate, a first insulating layer formed on the substrate, a first conductive layer having thin- and thick-film portions formed on the first insulating layer, a second insulating layer formed on part of the first insulating layer and the thick-film portion of the first conductive layer excluding a contact area thereof, and a second conductive layer formed on the contact area of the first conductive layer and the second insulating layer.

According to the present invention, since the first conductive layer is formed to have a sufficient thickness at the contact area, when the contact hole is formed in the second insulating layer, all of the first conductive layer portion corresponding to the contact area is not completely etched. As a result, the direct contact between the first conductive layer and the substrate is reliably prevented.

DETAILED DESCRIPTION OF THE PREFERRED EMBODIMENT

Figure 1:
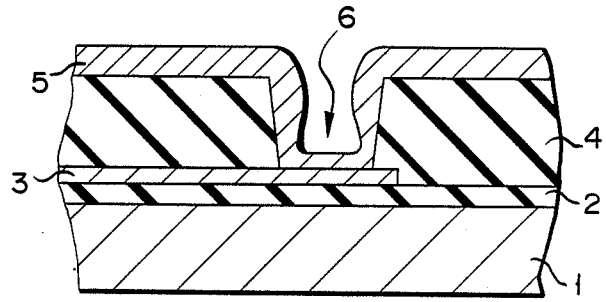
FIG. 1 shows a sectional view of a conventional semiconductor device wherein upper and lower conductive layers are connected at the contact area.
Figure 2:
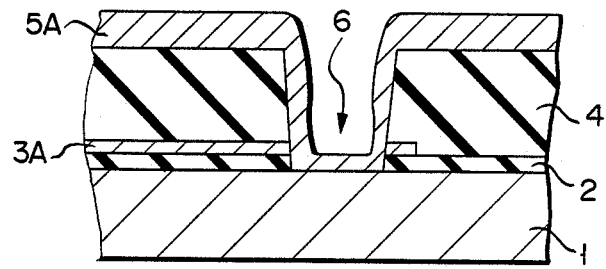
FIG. 2 shows a sectional view of a semiconductor device wherein, when the lower conductive layer in the device shown in FIG. 1 is made thin, a defect occurs in the contact area.
Figure 3:
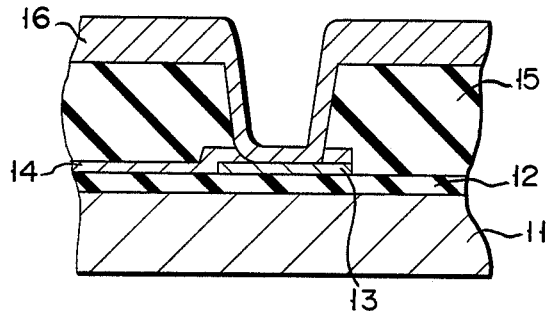
FIG. 3 shows a sectional view of a semiconductor device according to an embodiment of the present invention.

FIG. 3 shows a semiconductor device according to an embodiment of the present invention. This device is formed in accordance with the following manufacturing steps. First, $SiO_2$ insulating layer 12 having a thickness of 4,000Å (0.4 μm) is formed on semiconductor substrate 11. Polycrystalline silicon conductive layer 13 having a thickness of 1,000Å (0.1 μm) is formed on a local area of layer 12. Subsequently, a polycrystalline silicon conductive layer having a thickness of 500Å (0.05 μm) is formed on layers 12 and 13 and is selectively etched to form thin conductive layer 14 on a predetermined region of layer 12 and on layer 13. $SiO_2$ insulating layer 15 having a thickness of 7,000Å (0.7 μm) is formed on layers 12 and 14. Part of layer 15 is then selectively etched by, e.g., the RIE method, in order to form a contact hole and thus expose part of layer 13 or 14. Etching is performed so that the bottom of the contact hole reaches the upper surface region of layer 13. In this case, the ratio of the etching rate of layer 15 to the etching rate of layers 13 and 14, i.e., the etching selectively is as small as about 5, and the etching time is set, taking the processing margin into consideration, to be 1.5 times the standard etching time usually required for etching layer 15 to form a contact hole. Since the total thickness of layers 13 and 14 is as large as about 1,500Å (0.15 μm), layers 13 and 14 are not completely etched in the direction of thickness upon etching. In etching, for example, only selected part of layer 14 is etched in the direction of thickness to expose the upper surface of layer 13, and layer 12 is not etched. Therefore, the contact hole is not formed to extend through layers 13, 14 and 12.

After etching, Al wiring layer 16 is formed on layer 15 and the exposed portion of layer 13, thus completing the semiconductor device shown in FIG. 3.

As shown in FIG. 3, even when part of layer 13 is exposed during etching, layer 16 sufficiently contacts the upper surface of layer 13 which is in reliable electrical contact with layer 14, and also directly contacts the side wall of layer 14. Therefore, layer 16 is formed in electrically good contact with layer 14.

The thickness of layer 13 can be set in advance to an appropriate value by calculation in accordance with the thickness of layers 14 and 15, the etching selectivity and processing margin.

In the embodiment, layer 14 is formed of polycrystalline silicon. However, layer 14 can be formed of a refractory metal such as W or Mo; a silicide such as MoSi; a double layered polyside such as polisilicon/MoSi2; single crystalline silicon crystallized by layer annealing technique, or amorphous silicon.

Polycrystalline silicon is used to form layer 13 in the embodiment. However, layer 13 can be preferrably formed of any material described above which can be made in good ohmic contact with layer 14.

Further, layer 16 can be formed of not only Al, but also any material described above which can be made in good ohmic contact with at least layer 13.

In a case where at least two of layers 13, 14 and 16 are formed of silicon, it is desirable that impurities of the same type are doped in the silicon layers.

As described above, according to the present invention, layer 13 having an appropriately selected thickness is formed under layer 14 at the contact area. Therefore, even if layer 14 is thin, layer 12 is not etched during etching, and thus layer 16 is not shortcircuited with substrate 11, thereby improving the manufacturing yield and reliability.

Although an embodiment of the present invention has been described above, the present invention is not limited to this. For example, conductive layer 14 can be formed to cover the upper surface and all side surfaces of conductive layer 13 in the contact area.

What is claimed is:

1. A semiconductor device comprising:
   a semiconductor substrate;
   a first insulating layer formed on said substrate;
   a conductive member having a predetermined thickness formed on that part of said first insulating layer which corresponds to a contact area;
   a first conductive layer formed on said first insulating layer and said conductive member at least part of said first conductive layer which is formed on said first insulating layer acting as a resistance layer;
   a second insulating layer, formed on said first insulating layer and said first conductive layer, and having a contact hole reaching said first conductive layer at least at said contact area; and
   a second conductive layer formed on said second insulating layer and said conductive member at said contact area and in contact with a side wall of the said first conductive layer at said contact area.

2. A device according to claim 1, wherein said first conductive layer is formed of the same material as said conductive member.

3. A device according to claim 2, wherein said conductive member includes a material selected from the group consisting of silicon, polycrystalline silicon, amorphous silicon, single crystalline silicon, tungsten, molybdenum, molybdenum silicide, and a double layer structure of polysilicon/Mosi2.

4. A device according to claim 3, wherein said first conductive layer includes polycrystalline silicon.

5. A device according to claim 2, wherein said first conductive layer includes polycrystalline silicon.

6. A device according to claim 1, wherein said conductive member includes a material selected from the group consisting of silicon, polycrystalline silicon, amorphous silicon, single crystalline silicon, tungsten, molybdenum, molybdenum silicide, and a double layer structure of polysilicon/MoSi2.

7. A device according to claim 1, wherein said first conductive layer includes polycrystalline silicon.

8. A device according to claim 1, wherein at least two of said conductive member, and first and second conductive layers are formed of silicon layers having the same type of impurities doped therein.

9. A device according to claim 4, wherein said conductive member is formed of polycrystalline silicon.

10. A semiconductor device comprising:
    a semiconductor substrate;
    a first insulating layer formed on said substrate;
    a conductive member having a predetermined thickness formed on that part of said first insulating layer which corresponds to a contact area;
    a first conductive layer formed on said first insulating layer and said conductive member, at least part of said first conductive layer which is formed on said first insulating layer being formed thinner than said conductive member to act as a resistance layer;
    a second insulating layer, formed on said first insulating layer and said first conductive layer, and having a contact hole reaching said first conductive layer at least at said contact area; and
    a second conductive layer formed on said second insulating layer and said first conductive layer or said conductive member at said contact area.

* * * * *